US012794460B2

(12) United States Patent
Takiguchi

(10) Patent No.: US 12,794,460 B2
(45) Date of Patent: Nov. 10, 2026

(54) DIFFERENTIAL SKEW GENERATION DEVICE AND DIFFERENTIAL SKEW GENERATION METHOD

(71) Applicant: ANRITSU CORPORATION, Kanagawa (JP)

(72) Inventor: Masashi Takiguchi, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 2 days.

(21) Appl. No.: 19/016,380

(22) Filed: Jan. 10, 2025

(65) Prior Publication Data

US 2025/0260395 A1 Aug. 14, 2025

(30) Foreign Application Priority Data

Feb. 8, 2024 (JP) ................................ 2024-017901

(51) Int. Cl.
*H03K 5/01* (2006.01)

(52) U.S. Cl.
CPC .................................... *H03K 5/01* (2013.01)

(58) Field of Classification Search
CPC ....................................................... H03K 5/01
See application file for complete search history.

(56) References Cited

U.S. PATENT DOCUMENTS 11,228,478 B1 * 1/2022 Neofytou ............ H04L 27/0014
2022/0021412 A1 * 1/2022 Iwai .................... H04B 1/7073

FOREIGN PATENT DOCUMENTS

JP H1096760 A 4/1998

* cited by examiner

*Primary Examiner* — Metasebia T Retebo
(74) *Attorney, Agent, or Firm* — McDonald Hopkins LLC

(57) ABSTRACT

A differential skew generation device 1 includes: a clock oscillator 2 that oscillates and outputs a clock signal; a first signal generator (PPG) 4A that outputs a positive signal to an evaluation target W at a timing of a signal in which a phase angle is adjusted by in-phase and quadrature-phase (IQ) modulation of the clock signal; and a second signal generator (PPG) 4B that outputs a negative signal to the evaluation target W at a timing of a signal in which a phase angle is adjusted by IQ modulation of the clock signal. The first signal generator (PPG) 4A and the second signal generator (PPG) 4B operate in synchronization with each other and allocate an integer unit of a unit interval (UI) of a set skew amount to transmission timing shift and a decimal unit to IQ modulation.

6 Claims, 1 Drawing Sheet

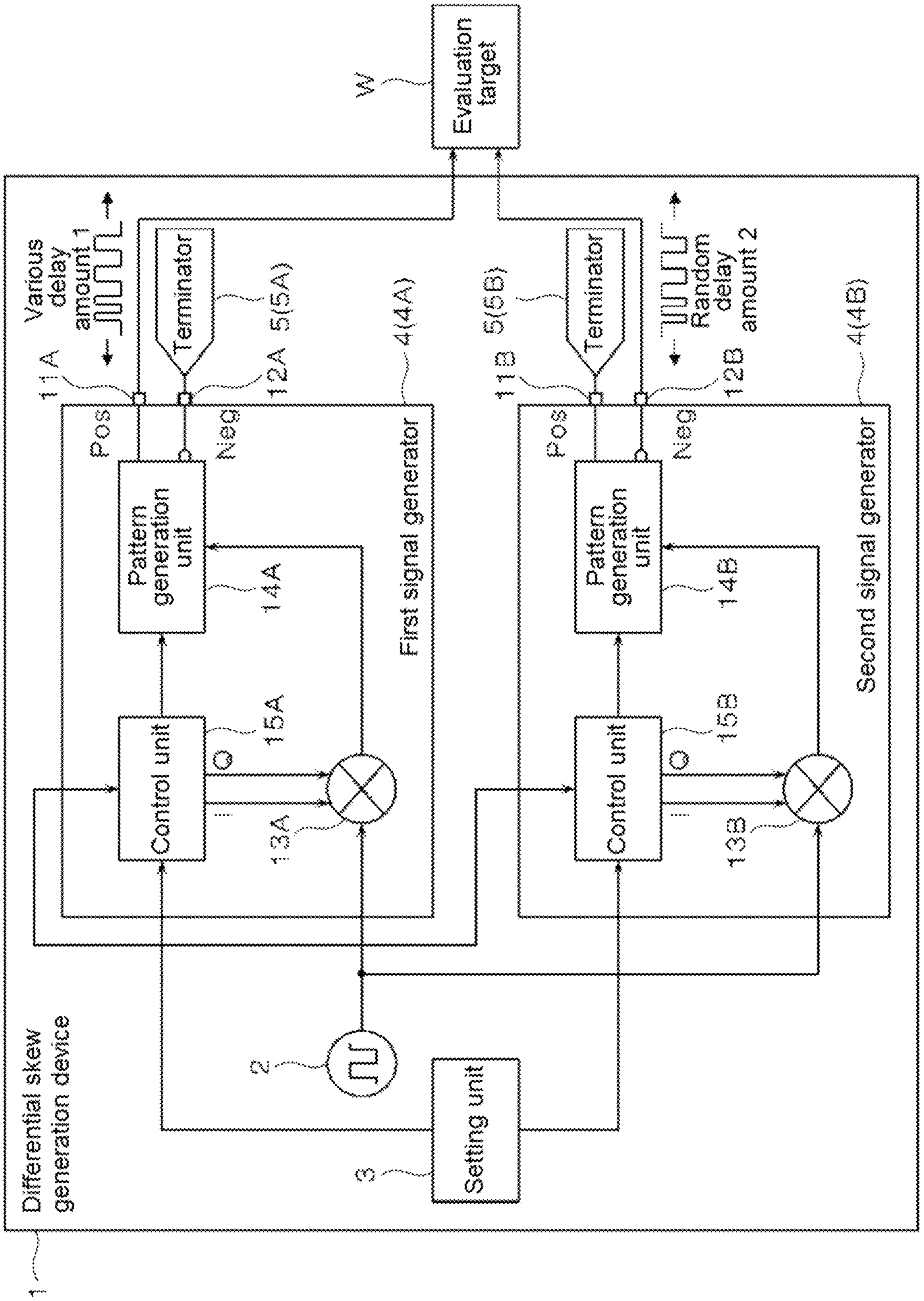
Evaluation target
W
Differential skew generation device
1
Setting unit
3
2
Control unit
15A
13A
I
Q
Pattern generation unit
14A
Pos
Neg
11A
12A
Terminator
5(5A)
4(4A)
First signal generator
Various delay amount 1
Control unit
15B
13B
I
Q
Pattern generation unit
14B
Pos
Neg
11B
12B
Terminator
5(5B)
4(4B)
Second signal generator
Random delay amount 2

DIFFERENTIAL SKEW GENERATION DEVICE AND DIFFERENTIAL SKEW GENERATION METHOD

TECHNICAL FIELD

The present invention relates to a differential skew generation device and a differential skew generation method that generate a differential skew, which is a time difference between a positive signal and a negative signal to be input to an evaluation target.

BACKGROUND ART

Since differential signal is advantageous for common mode noise, most of high-speed serial interfaces requiring high waveform quality uses differential signal. Since the differential signal is designed that a positive signal and a negative signal have the same arrival timing, in a case where a timing different (skew) is not sufficiently small, the differential transmission cannot exhibit effects and may even have adverse effects.

In particular, in a case where a differential signal passes through a differential trace, capacitive, inductive, or both coupling occurs between the positive signal and the negative signal, causing distortion or reflection due to skew, which significantly deteriorates the waveform quality.

In high-speed serial interfaces in recent years, a higher modulation rate or a multi-level amplitude modulation technology is used. For example, a 32 Gbaud PAM4 modulation is used in PCIe Gen6. Accordingly, requirements for waveform quality have become more severe, and thus the importance of evaluation of the effects of skew on transmission lines or devices increases. In addition, Patent Document 1 discloses a technology related to adjustment of skew.

Incidentally, one example of a method of evaluating the skew described above is a mechanical delay adapter, which is a device that mechanically varies a line length of a coaxial line.

RELATED ART DOCUMENT

Patent Document

[Patent Document 1] JP-A-1998-096760

DISCLOSURE OF THE INVENTION

Problem that the Invention is to Solve

However, since the mechanical delay adapter is mechanically operated, the mechanical delay adapter has limitations in repeatability, resolution, and variable range, and is thus not easy for automation. There are types that have a wider variable range, but in this case there is a trade-off relationship with resolution, and it is difficult to achieve both the variable range and the resolution. Furthermore, inserting a mechanical delay adapter affects transmission characteristics. It is necessary to separate whether the effect is due to the adapter or skew. While effects of frequency characteristics and insertion loss of the mechanical delay adapter can be substantially eliminated by performing calibration on an end surface of the mechanical delay adapter, calibration reference plane changes depending on the operation of the mechanical delay adapter, and thus it is not possible to strictly maintain phase of calibration reference. Coupling and reflection that occur on the line often depend on the trace length (phase), which is one parameter and is changed by the operation, so that there is a problem in that it is difficult to separate the effects of the skew.

Therefore, the present invention has been made in view of the above problems, and an object of the present invention is to provide a differential skew generation device and a differential skew generation method capable of varying a differential skew to a desired skew amount without performing a manual physical operation.

Means for Solving the Problem

In order to achieve the above object, a differential skew generation device according to a first aspect of the present invention a includes: clock oscillator that oscillates and outputs a clock signal; a first signal generator (Pulse Pattern Generator (PPG)) that outputs a positive signal to an evaluation target at a timing of a signal in which a phase angle is adjusted by in-phase and quadrature-phase (IQ) modulation of the clock signal; and a second signal generator (PPG) that outputs a negative signal to the evaluation target at a timing of a signal in which a phase angle is adjusted by IQ modulation of the clock signal, in which the first signal generator (PPG) and the second signal generator (PPG) operate in synchronization with each other, in a case of shifting a transmission timing of a signal by an integer unit of a unit interval (UI) of a set skew amount, shift a transmission timing of a bit of at least one of the positive signal and the negative signal by the integer unit of the UI, and in a case of shifting by a decimal unit of the UI of the set skew amount, allocate the decimal unit to the IQ modulation.

A differential skew generation device according to a second aspect of the present invention is the differential skew generation device according to the first aspect, in which, when the skew amount is set in units of time, the skew amount set in units of time is multiplied by a bitrate to convert the skew amount into a skew amount in units of UI.

A differential skew generation method according to a third aspect of the present invention includes: a step of oscillating and outputting a clock signal; a step of outputting a positive signal to an evaluation target from a first signal generator (PPG) at a timing of a signal in which a phase angle is adjusted by IQ modulation of the clock signal; a step of outputting a negative signal to the evaluation target from a second signal generator (PPG) at a timing of a signal in which a phase angle is adjusted by IQ modulation of the clock signal of the second signal generator (PPG); and a step of operating the first signal generator (PPG) and the second signal generator (PPG) in synchronization with each other, in a case of shifting a transmission timing of a signal by an integer unit of a UI of a set skew amount, shifting a transmission timing of a bit of at least one of the positive signal and the negative signal by the integer unit of the UI, and in a case of shifting by a decimal unit of the UI of the set skew amount, allocating the decimal unit to the IQ modulation.

A differential skew generation method according to a fourth aspect of the present invention is the differential skew generation method according to the third aspect, in which, when the skew amount is set in units of time, the skew amount set in units of time is multiplied by a bitrate to convert the skew amount into a skew amount in units of UI.

Advantage of the Invention

According to the present invention, it is possible to individually generate a positive signal and a negative signal from two synchronized signal generators (PPGs) to vary a differential skew to a desired skew amount, and it is possible to improve convenience compared to a case where a mechanical delay adapter in the related art is used, and to perform measurement with excellent variable range, repeatability, and resolution.

BRIEF DESCRIPTION OF THE DRAWINGS

FIG. 1 is a block diagram showing an internal configuration of a differential skew generation device according to an embodiment of the present invention.

BEST MODE FOR CARRYING OUT THE INVENTION

Hereinafter, embodiments for implementing the present invention will be described in detail with reference to the accompanying drawings.

As shown in FIG. 1, a differential skew generation device 1 of the present embodiment generates a differential skew that is a time difference between a positive signal and a negative signal, which are repeated signals inverted relative to each other and are input to an evaluation target W as two single-ended signals in a differential pair, with a desired skew amount, and is substantially configured to include a clock oscillator 2, a setting unit 3, a plurality of signal generators (PPGs) 4 (a first signal generator (PPG) 4A and a second signal generator (PPG) 4B), and terminators 5 (5A and 5B).

The differential skew generation device 1 synchronously operates the first signal generator (PPG) 4A and the second signal generator (PPG) 4B, operates an internal delay amount in each of the first signal generator (PPG) 4A and the second signal generator (PPG) 4B, and inputs the positive signal and the negative signal that have been varied to the desired skew amount to the evaluation target W, whereby the differential skew can be varied to the desired skew amount.

In FIG. 1, the positive signal is denoted by Pos, and the negative signal is denoted by Neg. In addition, in FIG. 1, the first signal generator (PPG) 4A and the second signal generator (PPG) 4B are shown as separate block configurations, but these can also be configured as a single module. The clock oscillator 2 oscillates and outputs a clock signal having a required frequency using a rectangular or a sinusoidal wave signal. The clock signal oscillated and output from the clock oscillator 2 is input to each of an IQ modulator 13A of the first signal generator (PPG) 4A and an IQ modulator 13B of the second signal generator (PPG) 4B, which will be described later.

The setting unit 3 is a GUI for a user to perform an input operation, and sets, as information necessary for generating the differential skew, a type of a pattern (positive signal and negative signal) to be input to the evaluation target W, a bitrate, and the skew amount of each of the first signal generator (PPG) 4A and the second signal generator (PPG) 4B for obtaining the differential skew.

Here, the skew amount can be input in terms of unit interval (UI) or time (sec). However, in the present embodiment, the skew amount is varied by IQ modulation and transmission timing shift as in a method of varying a skew amount, which will be described later, so that the operation is based on phase (UI), not time (sec). The transmission timing shift means shifting a transmission timing of a bit (or symbol in PAM case) of a signal by an integer unit of the UI of the set skew amount: N bits (symbols). Therefore, in a case where the skew amount is input and set in units of time (sec) by the setting unit 3, a control unit 15A (described later) of the first signal generator (PPG) 4A and a control unit 15B (described later) of the second signal generator (PPG) 4B convert and set the skew amount into units of UI based on an expression of UI=time (sec) of skew amount×bitrate.

In the present embodiment, since a resolution of the skew is 2 mUI, depending on an input value in units of time (sec) input and set by the setting unit 3, the skew may not be divisible by 2 mUI and may require rounding. In this case, the control unit 15A of the first signal generator (PPG) 4A and the control unit 15B of the second signal generator (PPG) 4B, which will be described later, calculate a time (sec) of the closest skew value divisible by 2 mUI, and perform a process of overwriting and setting the input value by the setting unit 3.

The signal generators (PPGs) 4 are constituted by the first signal generator (PPG) 4A and the second signal generator (PPG) 4B having the same configuration. The first signal generator (PPG) 4A includes a first output terminal 11A that outputs the positive signal and a second output terminal 12A that outputs the negative signal, and operates in synchronization with the second signal generator (PPG) 4B. As shown in FIG. 1, the first signal generator (PPG) 4A is configured to include the IQ modulator 13A, a pattern generation unit 14A, and the control unit 15A, and the terminator 5A is connected to the second output terminal 12A.

The IQ modulator 13A performs IQ modulation on the clock signal from the clock oscillator 2 using an I signal and a Q signal input based on a decimal unit of the skew amount set by the setting unit 3 under the control of the control unit 15A.

The pattern generation unit 14A generates a positive signal and a negative signal of a desired pattern based on the type of the pattern and the bitrate set by the setting unit 3 under the control of the control unit 15A, performs the transmission timing shift on the generated positive signal and negative signal based on the integer unit of the skew amount set by the setting unit 3, and outputs the positive signal among the signals subjected to the transmission timing shift from the first output terminal 11A.

The control unit 15A outputs a timing synchronization signal to the control unit 15B of the second signal generator (PPG) 4B such that the first signal generator (PPG) 4A and the second signal generator (PPG) 4B operate in synchronization with each other, and performs overall control of the IQ modulator 13A and the pattern generation unit 14A.

Specifically, the control unit 15A outputs the I signal and the Q signal corresponding to the decimal unit of the skew amount set by the setting unit 3 to the IQ modulator 13A, and adjusts and controls a phase angle of the clock signal from the clock oscillator 2. In addition, the control unit 15A controls the pattern generation unit 14A to generate the positive signal and the negative signal of the desired pattern based on the type of the pattern and the bitrate set by the setting unit 3 and to perform the transmission timing shift based on the integer unit of the skew amount set by the setting unit 3. Furthermore, in a case where the skew amount is input and set in units of time (sec) by the setting unit 3, the control unit 15A converts and sets the skew amount into units of UI based on the expression of UI=time (sec) of skew amount×bitrate, and in a case where rounding is required, the control unit 15A calculates the time (sec) of the closest skew value divisible by 2 mUI, and performs the process of overwriting and setting the input value by the setting unit 3.

The second signal generator (PPG) 4B has the same configuration as the first signal generator (PPG) 4A, includes a first output terminal 11B that outputs the positive signal and a second output terminal 12B that outputs the negative signal, and operates in synchronization with the first signal generator (PPG) 4A. As shown in FIG. 1, the second signal generator (PPG) 4B is configured to include the IQ modulator 13B, a pattern generation unit 14B, and the control unit 15B, and the terminator 5B is connected to the first output terminal 11B.

The IQ modulator 13B performs IQ modulation on the clock signal from the clock oscillator 2 using an I signal and a Q signal input based on the decimal unit of the skew amount set by the setting unit 3 under the control of the control unit 15B.

The pattern generation unit 14B generates a positive signal and a negative signal of the desired pattern based on the type of the pattern and the bitrate set by the setting unit 3 under the control of the control unit 15B, performs the transmission timing shift on the generated positive signal and negative signal based on the integer unit of the skew amount set by the setting unit 3, and outputs the negative signal among the signals subjected to the transmission timing shift from the second output terminal 12B.

The control unit 15B outputs a timing synchronization signal to the control unit 15A of the first signal generator (PPG) 4A such that the second signal generator (PPG) 4B and the first signal generator (PPG) 4A operate in synchronization with each other, and performs overall control of the IQ modulator 13B and the pattern generation unit 14B.

Specifically, the control unit 15B outputs the I signal and the Q signal corresponding to the decimal unit of the skew amount set by the setting unit 3 to the IQ modulator 13B, and adjusts and controls the phase angle of the clock signal from the clock oscillator 2. In addition, the control unit 15B controls the pattern generation unit 14B to generate the pattern (the positive signal and the negative signal) based on the type of the pattern and the bitrate set by the setting unit 3 and to perform the transmission timing shift based on the integer unit of the skew amount set by the setting unit 3. Furthermore, in a case where the skew amount is input and set in units of time (sec) by the setting unit 3, the control unit 15B converts and sets the skew amount into units of UI based on the expression of UI=time (sec) of skew amount×bitrate, and in a case where rounding is required, the control unit 15B calculates the time (sec) of the closest skew value divisible by 2 mUI, and performs the process of overwriting and setting the input value by the setting unit 3.

The terminator 5 is constituted by the terminator 5A connected to a free port of the first signal generator (PPG) 4A and a terminator 5B connected to a free port of the second signal generator (PPG) 4B, and prevents an effect of total reflection at a portion of an open end of output on signal output.

More specifically, the terminator 5A is connected to the second output terminal 12A, which is a free port, of two output terminals of the first signal generator (PPG) 4A, that is, the first output terminal 11A that outputs the positive signal and the second output terminal 12A that outputs the negative signal. In addition, the terminator 5B is connected to the first output terminal 11B, which is a free port, of two output terminals of the second signal generator (PPG) 4B, that is, the first output terminal 11B that outputs the positive signal and the second output terminal 12B that outputs the negative signal.

The terminator 5 is not limited to a connection configuration shown in FIG. 1, and the connection configuration may be reversed. That is, the terminator 5A may be connected to the first output terminal 11A of the pattern generation unit 14A of the first signal generator (PPG) 4A, and the terminator 5B may be connected to the second output terminal 12B of the pattern generation unit 14B of the second signal generator (PPG) 4B. In this case, a negative signal output from the second output terminal 12A of the pattern generation unit 14A of the first signal generator (PPG) 4A and a positive signal output from the first output terminal 11B of the pattern generation unit 14B of the second signal generator (PPG) 4B are input to the evaluation target W.

Next, the method of varying a skew amount using the differential skew generation device 1 configured as described above will be described.

First, the setting unit 3 sets the type of the pattern (positive signal, negative signal) to be input to the evaluation target W, the bitrate, and the skew amount of each of the first signal generator (PPG) 4A and the second signal generator (PPG) 4B.

Here, the skew amount can be input in UI or time (sec). However, in a case where the skew amount is input and set in units of time (sec), the control unit 15A of the first signal generator (PPG) 4A and the control unit 15B of the second signal generator (PPG) 4B convert and set the skew amount into units of UI based on the expression of UI=time (sec) of skew amount×bitrate.

In addition, in a case where the skew value is not divisible by 2 mUI depending on the input value in units of time (sec) input and set by the setting unit 3 and rounding is required, the control unit 15A of the first signal generator (PPG) 4A and the control unit 15B of the second signal generator (PPG) 4B calculate the time (sec) of the closest skew value divisible by 2 mUI, and perform the process of overwriting and setting the input value by the setting unit 3.

In a case where the skew amount in units of UI is set, the control unit 15A of the first signal generator (PPG) 4A and the control unit 15B of the second signal generator (PPG) 4B allocate the skew amount to a required IQ modulation amount and a transmission timing shift amount to control the IQ modulators 13A and 13B and the pattern generation units 14A and 14B.

Here, the transmission timing shift can only operate integer UI step, but variable range is wide (for example, ±64 UI). On the other hand, in the IQ modulation, the skew amount can be varied in decimal units (for example, 2 mUI), but a maximum change width is small (±360°=±1000 mUI). Therefore, in the present embodiment, the integer unit of the required skew amount (UI) is allocated to the transmission timing shift and the decimal unit is allocated to the IQ modulation to control both the transmission timing shift and the IQ modulation.

To provide specific example, in the case of setting the skew amount to 1250 (mUI), 1 bit transmission timing shift (1000 mUI)+IQ modulation 90° (250 mUI) are used. In addition, in the case of setting the skew amount to −2250 (mUI), −3 bit transmission timing shifts (−3000 mUI)+IQ modulation 270° (750 mUI) are used.

Each of the above-described examples is a case where IQ modulation ranging from 0° to 360° (0° to 2π)=0 to 1000 mUI is used, but a point at which the transmission timing shift is incremented is various. For example, IQ modulation can also be used with a center of ±180° (±π)=0 mUI with a range of ±500 mUI. In this case, in a case where the skew amount is 1250 (mUI), 1 transmission timing shift (1000 mUI)+IQ modulation 90° (250 mUI) is set. In addition, in the case of setting the skew amount to −2250 (mUI), −2 bit transmission timing shifts (−2000 mUI)+IQ modulation −90° (−250 mUI) are used.

It should be noted that, in each of the above-described examples, the example of the case where the skew amount is varied by both the transmission timing shift and the IQ modulation has been described, but the skew amount can also be varied by at least one of the transmission timing shift and the IQ modulation depending on the set skew amount. For example, in a case where the skew amount is 1000 (mUI), only 1 bit transmission timing shift (1000 mUI) is used. In a case where the set skew amount is 250 (mUI), only 90° (250 mUI) IQ modulation is used.

Meanwhile, the pattern generation unit 14A of the first signal generator (PPG) 4A and the pattern generation unit 14B of the second signal generator (PPG) 4B can generate a PRBS pattern or any pattern and can control a start timing of the pattern. Specifically, for example, in order to generate high speed data from lower speed generator, a circuit configuration can be configured with an FPGA that outputs 1/N data, a plurality of MUXs (N:1 MUX for MSB output, N: 1 MUX for LSB output, and 2:1 MUX for PAM4 output), and a D-FF, but the circuit configuration is not limited thereto.

As described above, according to the present embodiment, the positive signal and the negative signal can be individually generated from the two synchronized signal generators (PPGs) (the first signal generator (PPG) 4A and the second signal generator (PPG) 4B) to vary the differential skew to a desired skew amount. Accordingly, not only is convenience improved compared to a case where a mechanical delay adapter in the related art is used, but also variation of the skew amount with excellent variable range, repeatability, and resolution is possible. To provide specific numerical values, a variable range of ±64 UI and a resolution of 2 mUI are possible, and since an operation rate is 2.4 Gbaud to 64.2 Gbaud, in the case of conversion thereof in units of time, a maximum variable range is +26.6 ns and a minimum resolution is 31.1 fs.

Incidentally, the differential skew generation device 1 of the present embodiment is not configured to generate a positive signal and a negative signal from a single signal generator (PPG), but is configured to individually generate a positive signal and a negative signal from two signal generators (PPGs) (first signal generator (PPG) 4A and second signal generator (PPG) 4B) that operate in synchronization with each other as shown in FIG. 1. Therefore, each signal can be independently operated even for parameters other than the skew. The operable parameters depend on functions provided by the signal generator (PPG), and examples thereof include an amplitude, a Tx equalizer (emphasis), PAM linearity, and so on.

In addition, according to the present embodiment, since there is no effect on transmission line characteristics and no effect of reflection from a device under test, an evaluator can easily separate and evaluate only the effect of the skew.

Furthermore, since the positive signal and the negative signal can be operated independently, it is possible to intentionally break the symmetry of the waveform, and it is possible to evaluate skew from the viewpoint of the asymmetry of the waveform in addition to the skew from the viewpoint of the arrival timing.

In addition, even in a case where there is reflection from the evaluation target, there is no concern that the output is affected by differential coupling on a signal generator (PPG) side, and the evaluator can easily separate the effect of the skew.

Furthermore, regarding the operation of the skew amount, in a case where the skew amount is input in units of time or in units of UI by the setting unit 3 or the setting unit 3 is intuitively operated in a state where a waveform image having the skew is displayed, it becomes easy for the user to intuitively grasp how much skew is being applied.

Although the best embodiments of the differential skew generation device and the differential skew generation method according to the present invention have been described above, the present invention is not limited to the description and the drawings according to this form. That is, other forms, embodiments, operation techniques, and the like made by the persons skilled in the art based on this form are all included in the scope of the present invention.

DESCRIPTION OF REFERENCE NUMERALS AND SIGNS

1: Differential skew generation device
2: Clock oscillator
3: Setting unit
4: Signal generator (Pulse Pattern Generator (PPG))
4A: First signal generator (PPG)
4B: Second signal generator (PPG)
5 (5A, 5B): Terminator
11A, 11B: First output terminal
12A, 12B: Second output terminal
13A, 13B: IQ modulator
14A, 14B: Pattern generation unit
15A, 15B: Control unit
W: Evaluation target

What is claimed is:

1. A differential skew generation device comprising:

a clock oscillator that oscillates and outputs a clock signal;

a first signal generator that outputs a positive signal to an evaluation target at a timing of a signal in which a phase angle is adjusted by in-phase and quadrature-phase (IQ) modulation of the clock signal; and a second signal generator that outputs a negative signal to the evaluation target at a timing of a signal in which a phase angle is adjusted by IQ modulation of the clock signal, wherein the first signal generator and the second signal generator operate in synchronization with each other to generate a skew amount between the positive signal and the negative signal based on a unit interval (UI), wherein when the UI has an integer value, a transmission timing of a bit of at least one of the positive signal and the negative signal is shifted by the integer value, and wherein when the UI has a decimal value, the IQ modulation of the clock signal is based on the decimal value.

2. The differential skew generation device according to claim 1, wherein, when the skew amount is set in units of time, the skew amount set in units of time is multiplied by a bitrate to convert the skew amount into a skew amount in units of UI.

3. A differential skew generation method comprising:

a step of oscillating and outputting a clock signal;

a step of outputting a positive signal to an evaluation target from a first signal generator at a timing of a signal in which a phase angle is adjusted by IQ modulation of the clock signal;

a step of outputting a negative signal to the evaluation target from a second signal generator at a timing of a signal in which a phase angle is adjusted by IQ modulation of the clock signal of the second signal generator; and a step of operating the first signal generator and the second signal generator in synchronization with each other to generate a skew amount between the positive signal and the negative signal based on a unit interval (UI) by:

when the UI has an integer value, shifting a transmission timing of a bit of at least one of the positive signal and the negative signal by the integer value, and when the UI has a decimal value, performing the IQ modulation based on the decimal value.

4. The differential skew generation method according to claim 3, wherein, when the skew amount is set in units of time, the skew amount set in units of time is multiplied by a bitrate to convert the skew amount into a skew amount in units of UI.

5. The differential skew generation device according to claim 1, wherein the first and second signal generators are pulse pattern generators.

6. The differential skew generation method according to claim 3, wherein the first and second signal generators are pulse pattern generators.

* * * * *